United States Patent [19]

Oelsch

[11] Patent Number: 4,658,235

[45] Date of Patent: Apr. 14, 1987

[54] KEYBOARD PRINTED CIRCUIT FILM AND METHOD OF FABRICATION

[75] Inventor: Jürgen Oelsch, Hohenroth, Fed. Rep. of Germany

[73] Assignee: Preh Elektrofeinmechanische Werke, Jakob Preh, Nachf. GmbH & Co., Bad Neustadt/Saale, Fed. Rep. of Germany

[21] Appl. No.: 777,165

[22] Filed: Sep. 18, 1985

[30] Foreign Application Priority Data

Sep. 21, 1984 [DE] Fed. Rep. of Germany ....... 3434664

[51] Int. Cl.[4] .............................................. H01C 1/012
[52] U.S. Cl. ...................................... 338/307; 29/846; 338/309
[58] Field of Search ........................ 338/307, 308, 309; 29/846

[56] References Cited

U.S. PATENT DOCUMENTS

| | | | |
|---|---|---|---|
| 3,384,931 | 5/1968 | Cochran | 29/846 |
| 3,766,308 | 10/1973 | Loro | 29/846 |
| 4,331,949 | 5/1982 | Kagawa | 338/307 |

Primary Examiner—John Sipos
Attorney, Agent, or Firm—Woodcock Washburn Kurtz Mackiewicz & Norris

[57] ABSTRACT

A plurality of switching points are connected in groups to respective terminal contact points via conductor strips on a keyboard printer circuit film. In order to achieve suppression of the coupling capacitances with simple means, decoupling resistor strips are printed between adjacent pairs of the conductor strips and are connected with the said conductor strips. The decoupling resistor strips consist of the same carbon resistor layer material as the terminal contact points.

6 Claims, 1 Drawing Figure

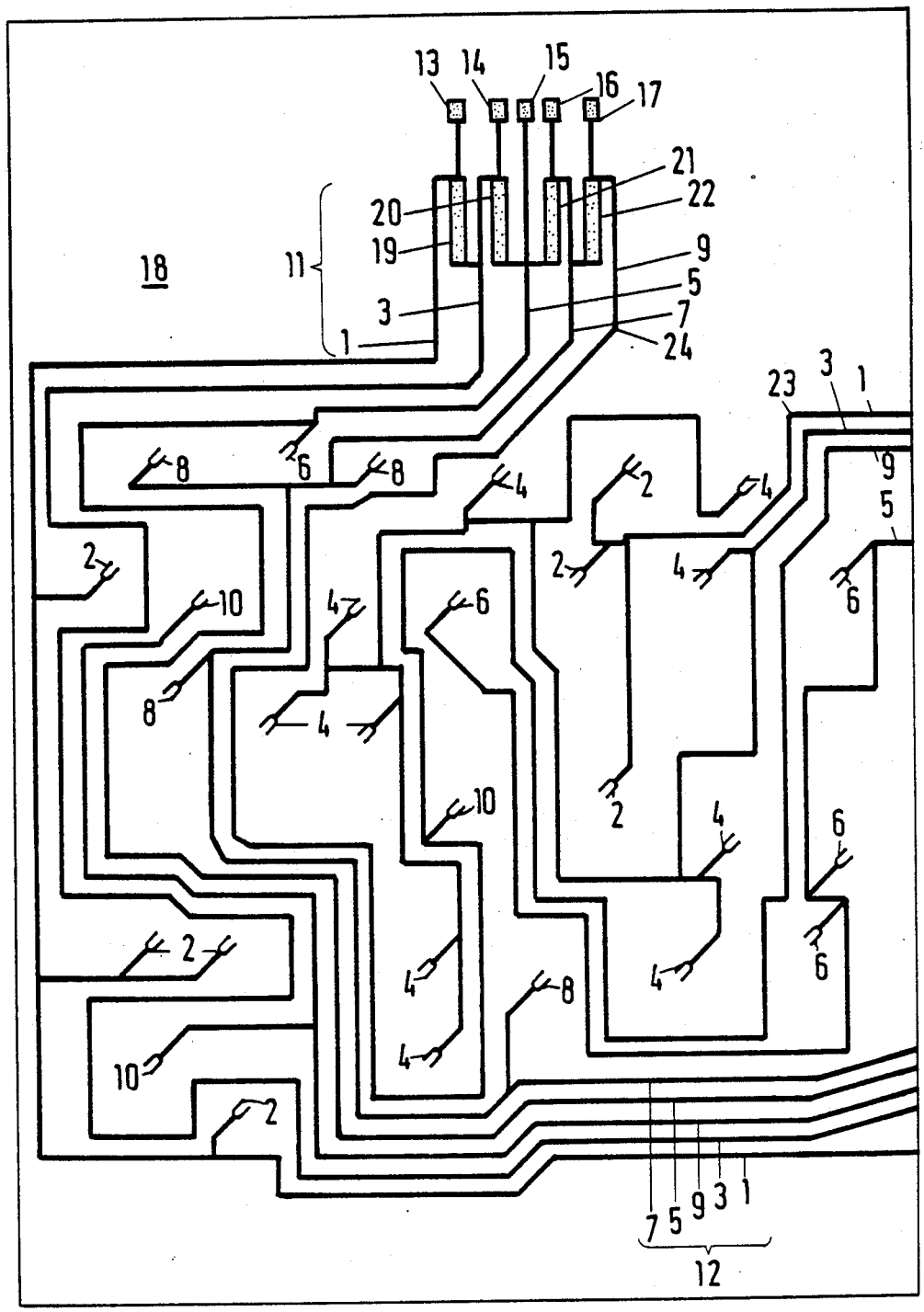

KEYBOARD PRINTED CIRCUIT FILM AND METHOD OF FABRICATION

BACKGROUND OF THE INVENTION

The present invention relates to keyboard printed circuit films and, in particular, such a film comprising switching contact points which are connected in groups to terminal contact points via conductor strips printed on the film, and having means for reducing the coupling capacitance normally presented between adjacent conductor strips where they lead to terminal contact points.

In such keyboard printed circuit arrangements, it is common that two films whose switching contact points are congruent are opposite to each other. Keys are arranged above these switching contact points, and the actuation of these keys leads to contacting of the respective switching contact points.

The conductor strip material which is conventionally utilized has been found to have low resistance to effects occurring during operation in the area of the terminal contact points and of the switching contact points. The terminal contact points and/or the switching contact points are therefore often made from a carbon resistor layer which is substantially more resistant to the stresses occurring during operation. However, coupling capacitances develop between the conductor strips in such printed circuit films. These capacitances frequently exert disturbing effects on the electronic circuit connected to them.

SUMMARY OF THE INVENTION

The object of the present invention is to provide a means for suppressing the influence of the coupling capacitances of the conductor strips in a printed circuit film for use in a keyboard device and to provide a method and design for incorporating such suppression measures with very simple steps.

The above objects are provided according to the present invention in a printed circuit film of the type having plural switching contact points and associated terminal contact points, wherein resistor strips are printed on the film between adjacent conductor strips, and these resistor strips are connected with the conductor strips, the resistor strips consisting of the same carbon layer resistor material as the terminal contact points and the switching contact points.

It has been found that resistors with a given resistance, inserted between the conductor strips, cause attenuation of the capacitive coupling otherwise presented at the terminal contact points. Arranging such resistors as discrete resistors or in a separate printing operation would be expensive. According to the present invention, the resistors consist of the same carbon layer material as the terminal contact points and the switching contact points. The switching contact points, the terminal contact points and the resistor strips between the conductor strips can thus be applied on the film in the same printing operation. The resistor strips are made relatively long compared to the switching and terminal contact points because a resistor paste with low ohmic resistance is used for the terminal contact points and the switching contact points, and resistors with high ohmic resistance are needed between the conductor strips.

Another advantage of the film arrangement of the invention lies in the fact that the resistors between the conductor strips do not cross the latter, whereby they can be printed on a film in a simple manner without an additional insulating layer.

In a preferred embodiment of the present invention, the resistor strips are printed in an area between the conductor strips in which these conductor strips are parallel to each other, and the resistor strips extend longitudinally parallel to the conductor strips, each resistor strip being connected with the adjacent conductor strips between which it is located. It is thus possible to arrange the resistor strips on the film in a space-saving manner. In addition, the resistor strips extending parallel to and between the conductor strips also provide an additional decoupling effect.

It has been found that it is not necessary to provide resistor strips on the two opposite films of the keyboard printed circuit film. It is sufficient to provide the resistor strips on just one of the films in order to achieve a decoupling effect. If the resistors are parallel between n conductor strips, only n-1 resistor strips are needed.

BRIEF DESCRIPTION OF THE DRAWING

Further advantageous embodiments of the present invention will become apparent from the following illustrative description. The Figure shows a film printed with conductor strips and resistor strips for a keyboard printed circuit film in accordance with this invention.

DESCRIPTION OF THE PREFERRED EMBODIMENT

Conductor strips 1 lead to a plurality of switching contact points 2. Conductor strips 3 lead to a plurality of switching contact points 4. A conductor strip 5 leads to the switching contact points 6. A conductor strip 7 leads to the switching contact points 8. Conductor strips 9 lead to the switching contact points 10. All of conductor strips 1, 3, 5, 7, and 9 are deposited on film 18; since the film is shown in the FIGURE as a cutaway film, only some of the switching contact points are visible.

The conductor strips 1, 3, 5, 7, and 9 are parallel to each other in the areas 11 and 12. Each conductor strip 1, 3, 5, 7, and 9 terminates at a respective one of the terminal contact points 13 through 17. The distance between the terminal contact points 13 through 17 corresponds to the grid of an ordinary terminal strip.

The conductor strips 1, 3, 5, 7, and 9 consist of a conducting silver paste on the film 18. The switching contact points 2, 4, 6, 8, and 10 and the terminal contact points 13 through 17 are all printed from a common resistor paste with low ohmic resistance, on the film 18.

Resistor strips 19, 20, 21, and 22 are printed between the conductor strips 1, 3, 5, 7, and 9 in the area 11 from the same resistor paste. The resistor strips 19 through 22 are substantially longitudinally parallel to the conductor strips 1, 3, 5, 7, and 9. A first of the ends of the resistor strip 19 is connected to the conductor strip 1, and the second end is connected to the conductor strip 3. The other resistor strips are also connected between adjacent conductor strips in an analogous manner. The resistance of each resistor strip is, as an example, 9 kohms. The resistor strips 19 through 22 are long in comparison to the switching contact points 2, 4, 6, 8 and 10 and the terminal contact points 13 through 17. This enables them to have the required resistance and yet be prepared from the same paste. Resistor strips of this type can also be arranged additionally or as an alternative in the area 12 as well.

Since one of the ends of each of the resistor strips 19, 20, 21, and 22 is inherently very close to the terminal contact points 13, 14, 16, and 17, these terminal contact points and the resistor strips can be printed in a continuous form without any conductor strip segments between the terminal contact points and the resistor strips. The conductor strips then branch off directly from the continuous resistor strip.

The series-connected system of the resistor strips 19 through 22 lies electrically between the outer conductor strips 1 and 9. If an additional resistor is desired directly between the conductor strips 1 and 9, this can be provided between point 23 of the conductor strip 1 and point 24 of conductor strip 9, without crossing any conductor.

The influence of coupling capacitances of the keyboard printed circuit film on an electronic circuit connected to the terminal contact points is suppressed by the resistor system described.

I claim:

1. A keyboard printed circuit film, comprising:
   a film having thereon a plurality of switching contact points,
   a plurality of terminal contact points on said film,
   a plurality of conductor strips on said film, each conductor strip connecting a respective group of said switching contact points to a respective one of said terminal contact points, wherein said conductor strips are parallel to each other in an area adjacent said terminal contact points, each said terminal contact point consisting of a carbon resistor layer on said film, and a resistor strip comprising a layer of the same carbon resistor printed on said film between each respective adjacent pairs of said conductors in said area.

2. The keyboard printed circuit film in accordance with claim 1, characterized in that said resistor strips contain portions which are longitudinally parallel to said conductor strips in said area and that each said resistor strip is electrically connected with the two conductor strips between which it is located.

3. The keyboard printed circuit film in accordance with claim 1 or 2, characterized in that each said resistor strip and its associated terminal contact point comprises a continuous layer of said carbon resistor.

4. A method of fabricating a keyboard having a pair of printed circuit films, said films having opposing switching contact points, comprising:
   printing on a first film a plurality of switching contact points,
   printing on said first film a plurality of terminal contact points,
   printing on said first film a plurality of conductor strips, each said strip connecting a respective group of said switching contact points to a respective one of said terminal contact points, and
   printing on only said first film a resistor strip between respective adjacent pairs of said conductors in an area adjacent to said terminal contact points, thereby reducing coupling capacitance presented at said contact points,
   wherein said step of printing terminal contact points is combined with said step of printing resistor strips and comprises printing said contact points and said resistor strips with a common resistor paste.

5. The method in accordance with claim 4, comprising printing at least one of said terminal contact points and one of said resistor strips as a continuous strip of said resistor paste.

6. The method in accordance with claim 4, wherein said resistor paste is a carbon resistor paste.

* * * * *